(12) United States Patent
Hong et al.

(10) Patent No.: US 12,393,310 B2
(45) Date of Patent: Aug. 19, 2025

(54) DISPLAY DEVICE

(71) Applicant: Samsung Display Co., Ltd., Yongin-si (KR)

(72) Inventors: Jongbeom Hong, Seongnam-si (KR); Gunshik Kim, Yongin-si (KR); Yongsub Shim, Gwangmyeong-si (KR); Younho Han, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/590,451

(22) Filed: Feb. 28, 2024

(65) Prior Publication Data

US 2024/0206302 A1 Jun. 20, 2024

Related U.S. Application Data

(63) Continuation of application No. 17/370,324, filed on Jul. 8, 2021, now Pat. No. 11,937,451.

(30) Foreign Application Priority Data

Aug. 20, 2020 (KR) ........................ 10-2020-0104828

(51) Int. Cl.
| | | |
|---|---|---|
| G06F 3/044 | (2006.01) | |
| G06F 3/041 | (2006.01) | |
| H10H 29/14 | (2025.01) | |
| H10K 50/858 | (2023.01) | |
| H10K 50/86 | (2023.01) | |
| H10K 59/122 | (2023.01) | |
| H10K 59/38 | (2023.01) | |
| H10K 59/40 | (2023.01) | |

(Continued)

(52) U.S. Cl.
CPC ............ *G06F 3/044* (2013.01); *G06F 3/0412* (2013.01); *H10H 29/142* (2025.01); *H10K 50/858* (2023.02); *H10K 50/86* (2023.02); *H10K 50/865* (2023.02); *H10K 59/122* (2023.02); *H10K 59/38* (2023.02); *H10K 59/40* (2023.02); *H10K 59/879* (2023.02); *H10K 59/8792* (2023.02); *H10K 59/12* (2023.02); *H10K 59/8731* (2023.02)

(58) Field of Classification Search
CPC .... H10K 59/122; H10K 59/38; H10K 59/879; H10K 59/8792
USPC .................................................. 349/110–111
See application file for complete search history.

(56) References Cited

U.S. PATENT DOCUMENTS

| 9,536,930 B2 | 1/2017 | Sasaki et al. |
| 10,199,608 B2 | 2/2019 | Woo et al. |
| 10,553,827 B2 | 2/2020 | Jang et al. |

(Continued)

FOREIGN PATENT DOCUMENTS

| KR | 1020150026928 A | 3/2015 |
| KR | 101850951 B1 | 4/2018 |

(Continued)

*Primary Examiner* — Charles S Chang
(74) *Attorney, Agent, or Firm* — CANTOR COLBURN LLP (57) ABSTRACT

A display device includes a display layer disposed on a substrate and divided into an emission area from which light is emitted and a non-emission area adjacent to the emission area, a refractive layer disposed on the display layer and including a first light blocking pattern and a second light blocking pattern disposed on the first light blocking pattern, and a window disposed on the refractive layer.

18 Claims, 7 Drawing Sheets

(51) Int. Cl.
*H10K 59/80* (2023.01)
*H10K 59/12* (2023.01)

(56) References Cited

U.S. PATENT DOCUMENTS

| | | |
|---|---|---|
| 10,804,334 B2 | 10/2020 | Song et al. |
| 10,868,280 B2 | 12/2020 | Lee et al. |
| 10,944,080 B2 | 3/2021 | Seo et al. |
| 2019/0206965 A1* | 7/2019 | Negishi ................ H10K 59/122 |
| 2020/0161590 A1* | 5/2020 | Seo ................... H10K 59/8792 |
| 2021/0074770 A1* | 3/2021 | Choe ...................... G02B 5/201 |
| 2021/0202918 A1* | 7/2021 | Hong ................... H10K 50/865 |
| 2022/0252951 A1* | 8/2022 | Kabe .................... G02F 1/1508 |

FOREIGN PATENT DOCUMENTS

| | | |
|---|---|---|
| KR | 1020180125674 A | 11/2018 |
| KR | 1020190086605 A | 7/2019 |
| KR | 1020190088148 A | 7/2019 |
| KR | 1020190130697 A | 11/2019 |
| KR | 1020200056735 A | 5/2020 |

\* cited by examiner

DISPLAY DEVICE

This application is a continuation of U.S. patent application Ser. No. 17/370,324, filed on Jul. 8, 2021, which claims priority to Korean Patent Application No. 10-2020-0104828, filed on Aug. 20, 2020, and all the benefits accruing therefrom under 35 U.S.C. § 119, the content of which in its entirety is herein incorporated by reference.

BACKGROUND

1. Field

Embodiments of the invention relate generally to a display device.

2. Description of the Related Art

A display device includes a display layer and a window, and the display layer emits light. The light passes through the window, and a user may view an image represented by combining the light which passes through the window.

In general, in order to protect a privacy of the user, a privacy protection film is attached on the window to adjust the viewing angle of the display device.

SUMMARY

A privacy protection film has disadvantages of reducing a luminance of a display device, changing a color of the light, and increasing a thickness of the display device.

Some embodiments provide a display device with adjusted viewing angle.

A display device in an embodiment may include a display layer disposed on a substrate and divided into an emission area from which light is emitted and a non-emission area adjacent to the emission area, a refractive layer disposed on the display layer and including a first light blocking pattern and a second light blocking pattern disposed on the first light blocking pattern, and a window disposed on the refractive layer.

In an embodiment, the first light blocking pattern and the second light blocking pattern may overlap each other.

In an embodiment, the first light blocking pattern and the second light blocking pattern may overlap the non-emission area.

In an embodiment, first light blocking pattern and the second light blocking pattern may not overlap the emission area.

In an embodiment, each of a first width of the first light blocking pattern and a second width of the second light blocking pattern may be smaller than a width of the non-emission area.

In an embodiment, the first width and the second width may be identical to each other.

In an embodiment, the refractive layer may further include a first filling layer covering the first light blocking pattern and including a flat surface and a second filling layer disposed on the first filling layer and covering the second light blocking pattern.

In an embodiment, the second light blocking pattern may contact the first filling layer.

In an embodiment, a first refractive index of the first filling layer and a second refractive index of the second filling layer may be greater than one.

In an embodiment, the refractive layer may further include a third light blocking pattern disposed on the second light blocking pattern.

In an embodiment, the display device may further include a polarizing layer disposed between the refractive layer and the window.

In an embodiment, the display device may further include a sensing pattern disposed between the display layer and the refractive layer and including a metal.

In an embodiment, the sensing pattern, the first light blocking pattern, and the second light blocking pattern may overlap each other.

In an embodiment, the display layer may include a first electrode, a pixel defining layer disposed on the first electrode and overlapping the non-emission area, an emission layer disposed on the first electrode and overlapping the emission area, a second electrode disposed on the pixel defining layer and the emission layer, and an encapsulation layer disposed on the second electrode. The sensing pattern may contact the encapsulation layer.

In an embodiment, the refractive layer may further include a color filter overlapping the emission area.

In an embodiment, the color filter may contact the first light blocking pattern.

In an embodiment, the color filter may contact the second light blocking pattern.

A display device in an embodiment may include a display layer disposed on a substrate and being divided into an emission area from which light is emitted and a non-emission area adjacent to the emission area, a refractive layer disposed on the display layer and including a plurality of light blocking patterns which are stacked in a direction perpendicular to a main plane extension direction of the refractive layer, and a window disposed on the refractive layer.

In an embodiment, the plurality of the light blocking patterns may overlap each other.

In an embodiment, widths of the plurality of the light blocking patterns may be identical to each other.

Therefore, the display device in embodiments may include a display layer, a refractive layer disposed on the display layer, and a window disposed on the refractive layer. The refractive layer may include a plurality of light blocking patterns, and the light blocking patterns may be vertically stacked. The light blocking patterns may block light. Accordingly, light passing through the window may pass through the window at an angle smaller than the target angle. In other words, light passing through the window at an angle greater than the target angle may be blocked by any one of the light blocking patterns before passing through the window. Accordingly, the viewing angle of the display device may be adjusted, and the display quality may be improved since the display device does not cause a color combination phenomenon.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the invention.

DETAILED DESCRIPTION

Illustrative, non-limiting embodiments will be more clearly understood from the following detailed description in conjunction with the accompanying drawings.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this invention will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Figure 1:
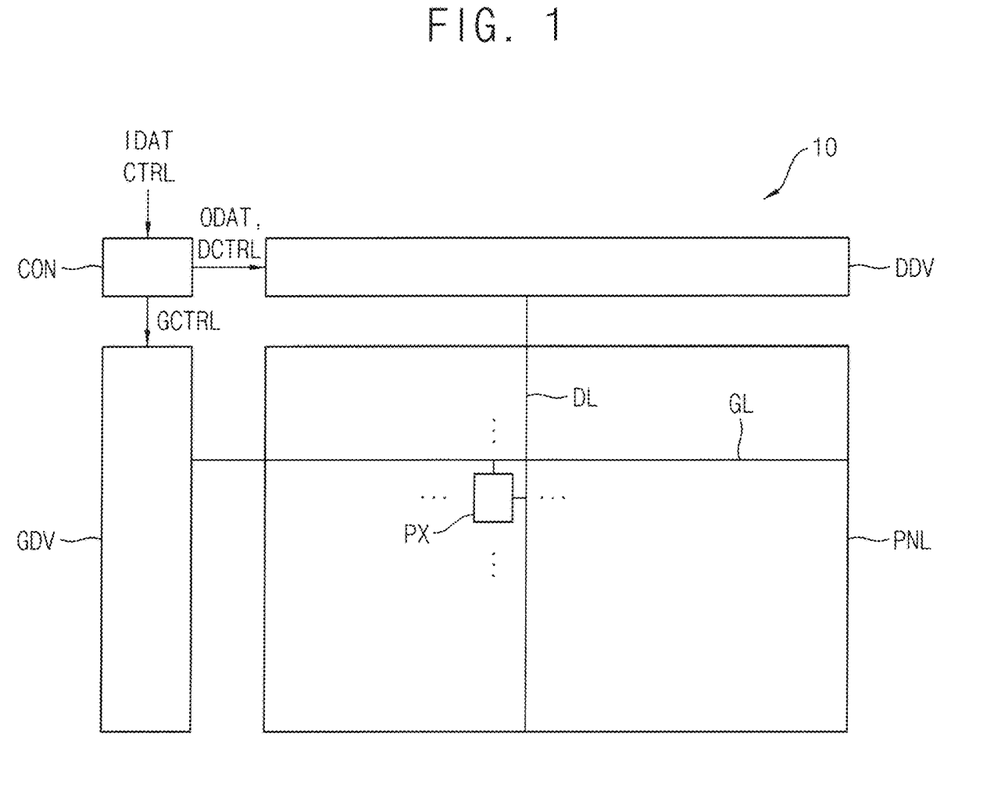
FIG. 1 is a block diagram illustrating an embodiment of a display device.

FIG. 1 is a block diagram illustrating a display device.

Referring to FIG. 1, a display device 10 in embodiments may include a display panel PNL, a data driver DDV, a gate driver GDV, and a controller CON.

The display panel PNL may include a plurality of pixels PX. In addition, a plurality of gate lines GL, a plurality of data lines DL, a plurality of high power voltage lines, and a plurality of initialization voltage lines may be disposed on the display panel PNL. In an embodiment, the gate lines GL, the data lines DL, the high power voltage lines, and the initialization voltage lines may be electrically connected to the pixels PX, for example.

The data driver DDV may generate a data voltage based on an output image data ODAT and a data control signal DCTRL. In an embodiment, the data driver DDV may generate a data voltage corresponding to the output image data ODAT and may output the data voltage in response to the data control signal DCTRL, for example. The data control signal DCTRL may include an output data enable signal, a horizontal start signal, and a load signal. In an embodiment, the data driver DDV may be implemented with one or more integrated circuits ("IC"s). In another embodiment, the data driver DDV may be disposed (e.g., mounted) on the display panel PNL or may be integrated into a peripheral area of the display panel PNL.

The gate driver GDV may generate a gate signal based on a gate control signal GCTRL. The gate signal may include a gate-on voltage for turning on a transistor and a gate-off voltage for turning off the transistor. The gate control signal GCTRL may include a vertical start signal, a clock signal, or the like. In an embodiment, the gate driver GDV may be disposed (e.g., mounted) on the display panel PNL or may be integrated in the peripheral area of the display panel PNL. In another embodiment, the gate driver GDV may be implemented with one or more ICs.

The controller CON (e.g., a timing controller T-CON) may receive an input image data IDAT and a control signal CTRL from an external host processor (e.g., graphics processing unit ("GPU")). In an embodiment, the input image data IDAT may be RGB data including red image data, green image data, and blue image data, for example. The control signal CTRL may include a vertical synchronization signal, a horizontal synchronization signal, an input data enable signal, a master clock signal, and the like. The controller CON may generate the gate control signal GCTRL, the data control signal DCTRL, and the output image data ODAT based on the input image data IDAT and the control signal CTRL.

Figure 2:
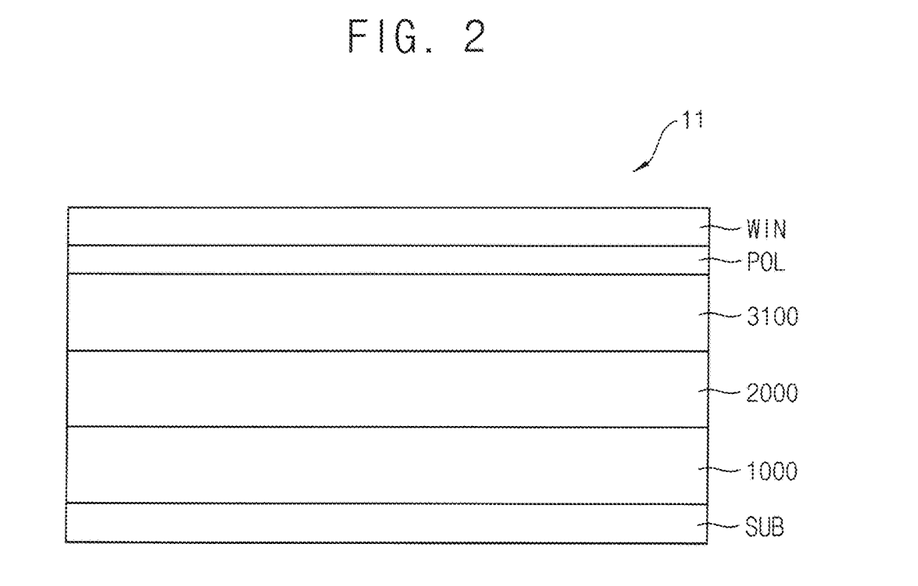
FIG. 2 is a cross-sectional view illustrating an embodiment of a display device of FIG. 1.
Figure 3:
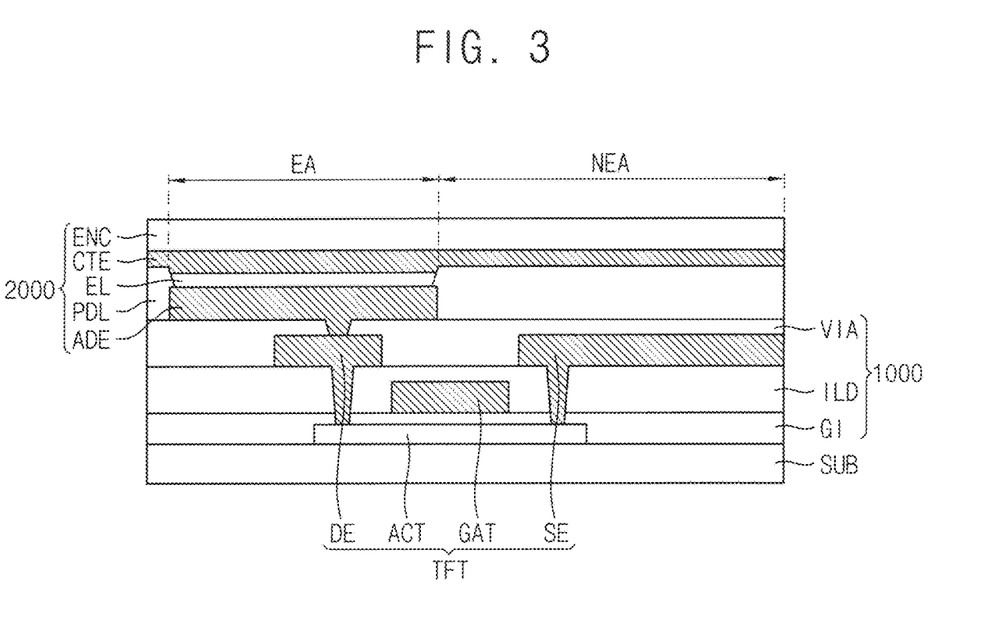
FIG. 3 is a cross-sectional view illustrating a substrate, a transistor layer, and a display layer included in the display device of FIG. 2.
Figure 4:
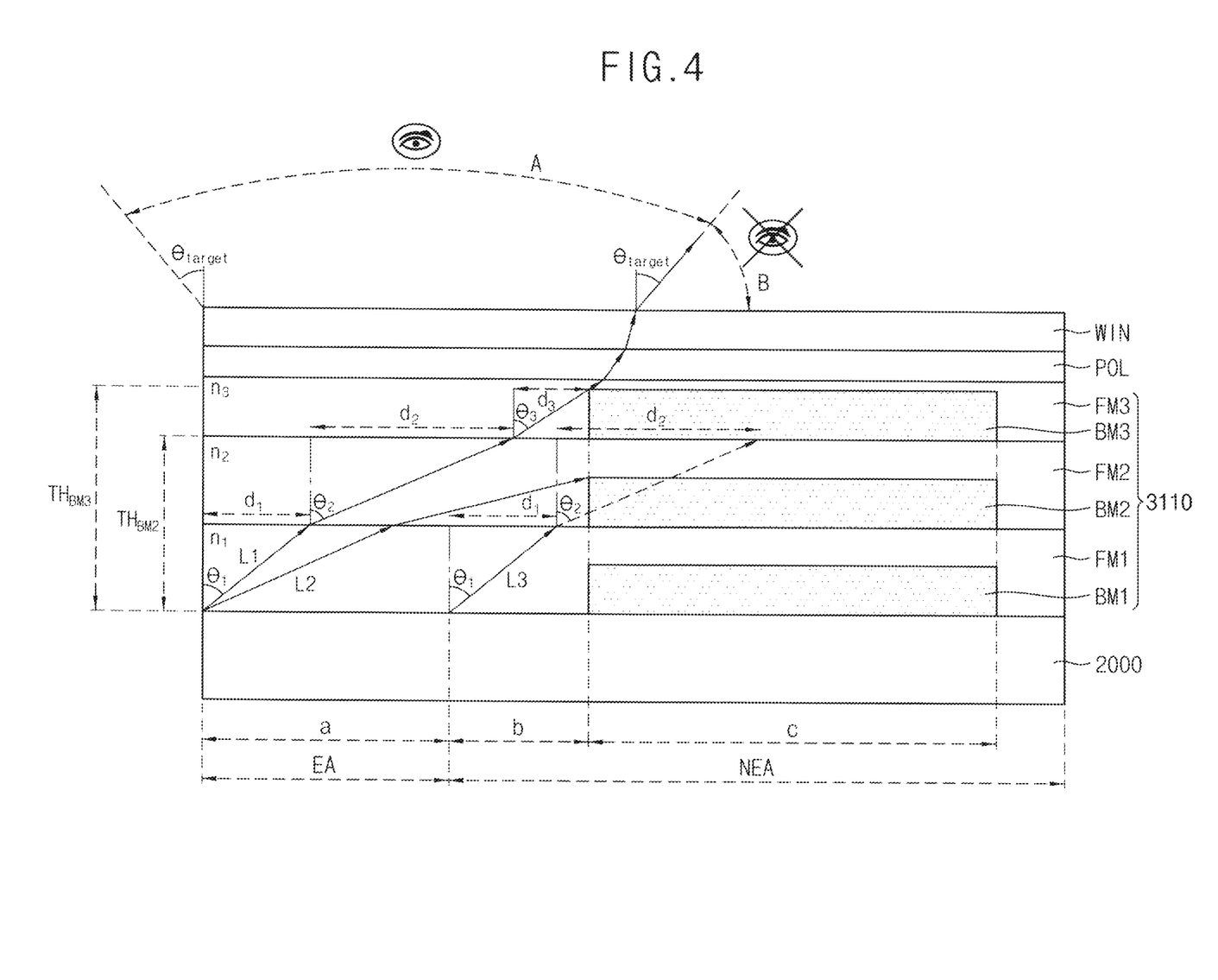
FIG. 4 is a cross-sectional view illustrating an embodiment of a display layer, a refractive layer, a polarizing layer, and a window included in the display device of FIG. 2.
Figure 5:
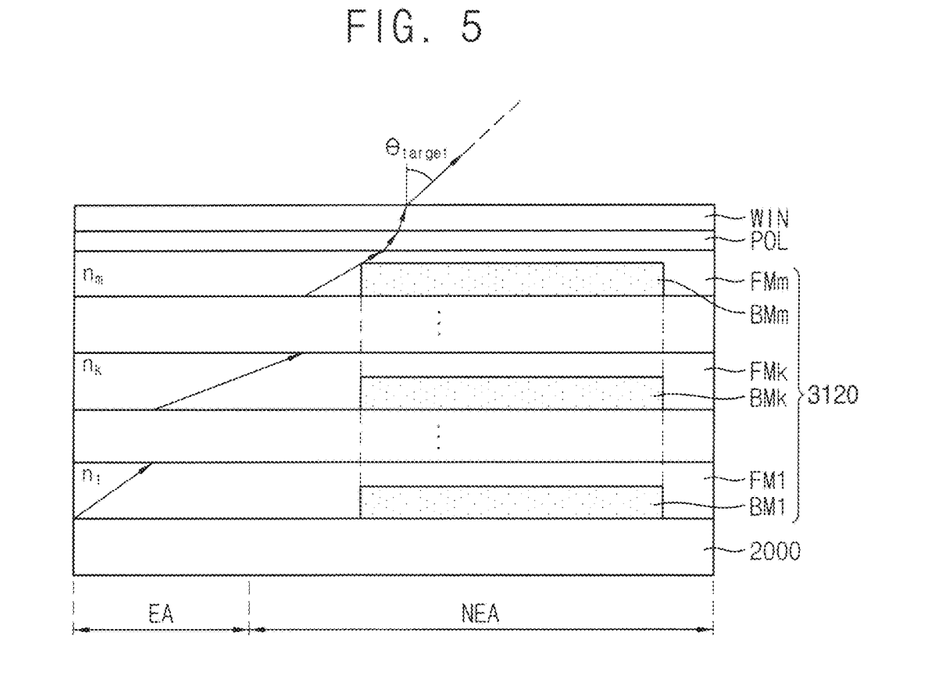
FIG. 5 is a cross-sectional view illustrating another embodiment of a display layer, a refractive layer, a polarizing layer, and a window included in the display device of FIG. 2.
Figure 6:
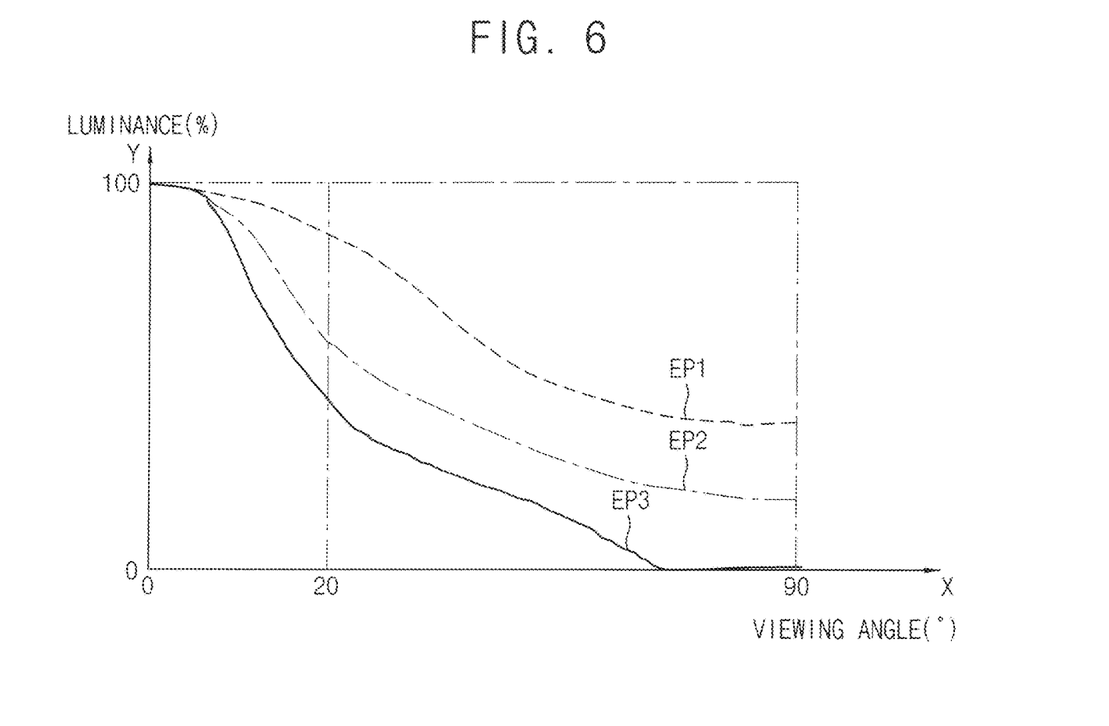
FIG. 6 is a graph illustrating a luminance according to a viewing angle.

FIG. 2 is a cross-sectional view illustrating an embodiment of a display device of FIG. 1. FIG. 3 is a cross-sectional view illustrating a substrate, a transistor layer, and a display layer included in the display device of FIG. 2. FIG. 4 is a cross-sectional view illustrating an embodiment of a display layer, a refractive layer, a polarizing layer, and a window included in the display device of FIG. 2. FIG. 5 is a cross-sectional view illustrating another embodiment of a display layer, a refractive layer, a polarizing layer, and a window included in the display device of FIG. 2. FIG. 6 is a graph illustrating a luminance according to a viewing angle.

Referring to FIGS. 1 and 2, a display device 11 in an embodiment may include a substrate SUB, a transistor layer 1000, a display layer 2000, a refractive layer 3100, a polarizing layer POL, and a window WIN.

The substrate SUB may include glass, quartz, plastic, or the like. In an embodiment, when the display device 11 is a rigid display device, the substrate SUB may be a glass substrate. In another embodiment, when the display device 11 is a flexible display device, the substrate SUB may be a plastic substrate.

The transistor layer 1000 may be disposed on the substrate SUB. The transistor layer 1000 may include a plurality of active patterns, a plurality of gate electrodes (e.g., the gate lines GL), and a plurality of lines (e.g., the data lines DL). The active patterns, the gate electrodes, and the lines may constitute transistors. The transistors may be driven according to the gate signal and may generate a driving current corresponding to the data voltage.

The display layer 2000 may be disposed on the transistor layer 1000. The display layer 2000 may include a plurality of light emitting diodes and a pixel defining layer. Each of the light emitting diodes may include a first electrode, an emission layer, and a second electrode, and the emission layer may be disposed in an opening defined in the pixel defining layer. The light emitting diodes are electrically connected to the transistors and may receive the driving current. In addition, the light emitting diodes may emit light corresponding to the driving current.

The refractive layer 3100 may be disposed on the display layer 2000. The refractive layer 3100 may include a plurality of filling layers and a plurality of light blocking patterns. The filling layers may refract the light, and the light blocking patterns may block the light. In an embodiment, the refractive layer 3100 may transmit light which is refracted at an angle less than or equal to a target angle. In addition, the refractive layer 3100 may block light that is refracted at an angle greater than the target angle. Accordingly, a viewing angle of the display device 11 may be adjusted.

The polarizing layer POL may be disposed on the refractive layer 3100. The polarizing layer POL may polarize external light. Accordingly, the polarizing layer POL may improve color reproducibility of the display device 11.

The window WIN may be disposed on the polarizing layer POL. The window WIN may protect the transistor layer 1000, the display layer 2000, and the refractive layer 3100 from external force. In addition, the window WIN may prevent impurities from penetrating into the transistor layer 1000, the display layer 2000, and the refractive layer 3100.

Referring to FIGS. 2 and 3, the transistor layer 1000 may include a transistor TFT, a gate insulating layer GI, an inter-insulating layer ILD, and a via-insulating layer VIA. The transistor TFT may include an active pattern ACT, a gate electrode GAT, a source electrode SE, and a drain electrode DE. The display layer 2000 may include a first electrode ADE, a pixel defining layer PDL, an emission layer EL, a second electrode CTE, and an encapsulation layer ENC.

The active pattern ACT may be disposed on the substrate SUB. The active pattern ACT may include a silicon semiconductor, an oxide semiconductor, or the like.

The gate insulating layer GI may cover the active pattern ACT and may be disposed on the substrate SUB. The gate insulating layer GI may include an insulating material (e.g., silicon oxide, silicon nitride, etc.).

The gate electrode GAT may be disposed on the gate insulating layer GI. In an embodiment, the gate electrode GAT may include a metal, for example. The gate electrode GAT may be a part of the gate line GL and may receive the gate signal.

The inter-insulating layer ILD may cover the gate electrode GAT and may be disposed on the gate insulating layer GI. The inter-insulating layer ILD may include an insulating material (e.g., silicon oxide, silicon nitride, etc.).

The source electrode SE and the drain electrode DE may be disposed on the inter-insulating layer ILD. In an embodiment, the source electrode SE and the drain electrode DE may include a metal, for example. The source electrode SE and the drain electrode DE may contact the active pattern ACT.

The via-insulating layer VIA may cover the source and drain electrodes SE and DE and may be disposed on the inter-insulating layer ILD. The via-insulating layer VIA may include an insulating material (e.g., an organic insulating material).

The transistor TFT may transfer the driving current from the source electrode SE to the drain electrode DE in response to the gate signal.

The first electrode ADE may be disposed on the via-insulating layer VIA. In an embodiment, the first electrode ADE may include a metal, for example. The first electrode ADE may be electrically connected to the transistor TFT. In an embodiment, the first electrode ADE may contact the drain electrode DE, for example.

The pixel defining layer PDL may be disposed on the via-insulating layer VIA. In an embodiment, the pixel defining layer PDL may include an organic material, for example. In addition, an opening may be defined in the pixel defining layer PDL. The opening may expose the first electrode ADE.

The emission layer EL may be disposed on the first electrode ADE. In an embodiment, the emission layer EL may be disposed in the opening, for example. The emission layer EL may emit light having luminance corresponding to the driving current.

The second electrode CTE may be disposed on the emission layer EL. In an embodiment, the second electrode CTE may include a metal and may be provided in a plate shape, for example.

In an embodiment, the first electrode ADE may be a reflective electrode, and the second electrode CTE may be a transmissive electrode. In an embodiment, the first electrode ADE may include a reflective conductive material (e.g., silver (Ag)), and the second electrode CTE may include a transmissive conductive material (e.g., indium tin oxide ("ITO") or a metal having a thickness of several nanometers (nm)), for example. Accordingly, light emitted from the emission layer EL may be irradiated onto the display layer 2000. In addition, light emitted from the emission layer EL may be irradiated at various angles.

The encapsulation layer ENC may be disposed on the second electrode CTE. The encapsulation layer ENC may include an inorganic layer and an organic layer, and may prevent impurities from penetrating into the emission layer EL.

In an embodiment, the display layer 2000 may be divided into an emission area EA and a non-emission area NEA. In an embodiment, the emission area EA may correspond to an area in which the emission layer EL is disposed, for example. In other words, the emission layer EL may overlap the emission area EA. Accordingly, light may be emitted in the emission area EA. In addition, the non-emission area NEA may correspond to an area in which the pixel defining layer PDL is disposed. In an embodiment, the non-emission area NEA may be adjacent to the emission area EA, for example.

Referring to FIGS. 2 and 4, the refractive layer 3110 may include a first light blocking pattern BM1, a first filling layer FM1, a second light blocking pattern BM2, a second filling layer FM2, a third light blocking pattern BM3, and a third filling layer FM3.

The first light blocking pattern BM1 may be disposed on the display layer 2000 (e.g., the encapsulation layer ENC). In an embodiment, the first light blocking pattern BM1 may block light. In an embodiment, the first light blocking pattern BM1 may include chromium (Cr), molybdenum (Mo), chromium oxide (CrOx), molybdenum oxide (MoOx), carbon pigment, black resin, or the like, for example.

The first filling layer FM1 may cover the first light blocking pattern BM1 and may be disposed on the display layer 2000. In an embodiment, the first filling layer FM1 may include a flat top surface, and a refractive index of the first filling layer FM1 may be greater than one. In an embodiment, the first filling layer FM1 may include an organic material, for example.

The second light blocking pattern BM2 may be disposed on the first filling layer FM1. In an embodiment, the second light blocking pattern BM2 may block light. In an embodiment, the second light blocking pattern BM2 may include chromium (Cr), molybdenum (Mo), chromium oxide (CrOx), molybdenum oxide (MoOx), carbon pigment, black resin, or the like, for example.

In an embodiment, the second light blocking pattern BM2 may overlap the first light blocking pattern BM1. In an embodiment, a first width of the first light blocking pattern BM1 taken along a direction (e.g., a horizontal direction in FIG. 4) perpendicular to a length extension direction of the first light blocking pattern BM1 may be the same as a second width of the second light blocking pattern BM2 taken along a direction (e.g., a horizontal direction in FIG. 4) perpendicular to a length extension direction of the second light blocking pattern BM2, for example.

The second filling layer FM2 may cover the second light blocking pattern BM2 and may be disposed on the first filling layer FM1. In an embodiment, the second filling layer FM2 may include a flat top surface, and a refractive index of the second filling layer FM2 may be greater than one. In an embodiment, the second filling layer FM2 may include an organic material, for example.

The third light blocking pattern BM3 may be disposed on the second filling layer FM2. In an embodiment, the third light blocking pattern BM3 may block light. In an embodiment, the third light blocking pattern BM3 may include chromium (Cr), molybdenum (Mo), chromium oxide (CrOx), molybdenum oxide (MoOx), carbon pigment, black resin, or the like, for example.

In an embodiment, the third light blocking pattern BM3 may overlap the first light blocking pattern BM1 and the second light blocking pattern BM2. In an embodiment, a third width of the third light blocking pattern BM3 taken along a direction (e.g., a horizontal direction in FIG. 4) perpendicular to a length extension direction of the third light blocking pattern BM3 may be the same as the first width and the second width, for example.

The third filling layer FM3 may cover the third light blocking pattern BM3 and may be disposed on the second filling layer FM2. In an embodiment, the third filling layer FM3 may include a flat top surface, and a refractive index of the third filling layer FM3 may be greater than one. In an embodiment, the third filling layer FM3 may include an organic material, for example.

In an embodiment, the first to third light blocking patterns BM1, BM2, and BM3 may overlap each other. In addition, the first to third light blocking patterns BM1, BM2, and BM3 may overlap the non-emission area NEA and may not overlap the emission area EA. In addition, the first to third widths may be the same as one another and may be smaller than a width of the non-emission area NEA taken along the same direction as that long which the widths of third light blocking patterns BM1 to BM3 are taken.

Among the lights emitted from the emission area EA, the first light L1 may pass through the window WIN. Among the lights, the second light L2 and the third light L3 may be blocked by at least one of the first to third light blocking patterns BM1, BM2, and BM3.

Specifically, the first light L1 may be emitted at a first angle θ1 with respect to a reference line perpendicular to the display layer 2000. The first light L1 may be refracted by the second filling layer FM2, the third filling layer FM3, the polarizing layer POL, and the window WIN. The first light L1 may pass through a target angle $\theta_{target}$ with respect to a reference line perpendicular to the window WIN.

The second light L2 may be emitted at a second angle θ2 with respect to a reference line perpendicular to the display layer 2000. The second angle θ2 may be greater than the first angle θ1. The second light L2 may be refracted by the second filling layer FM2. The second light L2 may be blocked by the second light blocking pattern BM2. Accordingly, the second light L2 may not pass through the window WIN.

The conventional refractive layer includes only the third light blocking pattern BM3. In other words, the conventional refractive layer does not include the first and second light blocking patterns BM1 and BM2. Accordingly, the second light L2 is not blocked by the third light blocking pattern BM3, but proceeds to the non-emission area NEA overlapping the third light blocking pattern BM3, and passes through the window at an angle greater than the target angle $\theta_{target}$. Accordingly, in the conventional display device including the refractive layer, the viewing angle of the display device is not adjusted. In addition, the conventional display device has a problem of deteriorating display quality due to color mixture phenomenon.

The refractive layer 3110 may include the first to third light blocking patterns BM1, BM2, and BM3. Accordingly, the second light L2 may be blocked by any one of the first to third light blocking patterns BM1, BM2, and BM3. Accordingly, light passing through the window WIN may pass through the window WIN at an angle smaller than the target angle $\theta_{target}$. In other words, light passing through the window WIN at an angle greater than the target angle $\theta_{target}$ may be blocked by any one of the first to third light blocking patterns BM1, BM2, and BM3, before passing through the window WIN. Accordingly, a user who looks at the display device 11 in area A shown in FIG. 4 may view the image, but a user who looks at the display device 11 in area B cannot view the image. Accordingly, the viewing angle of the display device 11 may be adjusted. In addition, since the display device 11 does not cause a color mixture phenomenon, display quality may be improved.

In an embodiment, components included in the refractive layer 3110 may satisfy Equation 1 below.

$$\theta_{target} = n_1 \times \sin\theta_1 = n_2 \times \sin\theta_2 = n_3 \times \sin\theta_3 \qquad \text{[Equation 1]}$$

In Equation 1, $n_1$, $n_2$, and $n_3$ may denote first to third refractive indices of the first, second, and third filling layers FM1, FM2, and FM3, respectively. $\theta_1$, $\theta_2$, and $\theta_3$ may denote first to third refractive angles of the first light L1, respectively. When the target angle $\theta_{target}$ and the first to third refractive indices are set according to Equation 1, the first to third refractive angles may be derived.

In addition, components included in the refractive layer 3110 may satisfy Equations 2 and 3 below.

$$d_1 + d_2 + d_3 = a + b \qquad \text{[Equation 2]}$$

$$TH_{BM3} = \frac{d_1}{\tan\theta_1} + \frac{d_2}{\tan\theta_2} + \frac{d_3}{\tan\theta_3} \qquad \text{[Equation 3]}$$

In Equation 2, $d_1$, $d_2$, and $d_3$ may denote first to third horizontal distances of the first light L1 in the first to third filling layers FM1, FM2, and FM3, respectively. Here, "a" may denote a width of the emission area EA, and "b" may denote a minimum horizontal distance from the emission area EA to the third light blocking pattern BM3. According to Equation 2, a sum (d1+d2+d3) of the first to third horizontal distances may be equal to a sum (a+b) of the width of the emission area EA and the minimum horizontal distance.

In Equation 3, $TH_{BM3}$ may denote a maximum vertical distance from the first light blocking pattern BM1 disposed at the lowermost portion to the third light blocking pattern BM3 disposed at the uppermost portion. In an embodiment, referring to FIG. 4, the maximum vertical distance $TH_{BM3}$ may be measured from a lower surface of the first light blocking pattern BM1 to an upper surface of the third light blocking pattern BM3.

In addition, components included in the refractive layer 3110 may satisfy Equations 4 and 5 below.

$$d_1 + d_2 \leq b + c \qquad \text{[Equation 4]}$$

$$TH_{BM2} = \frac{d_1}{\tan\theta_1} + \frac{d_2}{\tan\theta_2} \qquad \text{[Equation 5]}$$

In Equation 4, "c" may denote a width of the second light blocking pattern BM2. According to Equation 4, a sum $(d_1+d_2)$ of the first and second horizontal distances may be smaller than a sum (b+c) of the minimum horizontal distance and the widths of the second light blocking pattern BM2. Accordingly, as shown in FIG. 4, the third light L3 emitted from the emission area EA may be blocked by the second light blocking pattern BM2.

In Equation 5, $TH_{BM2}$ may denote a maximum vertical distance from the first light blocking pattern BM1 disposed at the lowermost portion to the second filling layer FM2. In an embodiment, referring to FIG. 4, the maximum vertical distance $TH_{BM2}$ may be measured from a lower surface of the first light blocking pattern BM1 to an upper surface of the second filling layer FM2.

Referring to FIGS. 2 and 5, the refractive layer 3120 may include a plurality of light blocking patterns BM1, BMk, and BMm (where m is an integer greater than one, k is an integer greater than one and less than m) and a plurality of filling layers FM1, FMk, and FMm. In an embodiment, the light blocking patterns BM1, BMk, and BMm may be vertically stacked and may overlap each other. In an embodiment, FMk, and FMm may have refractive indices $n_k$ and $n_m$, respectively. In addition, widths of the plurality of light blocking patterns may be the same as each other. As the refractive layer 3120 includes a plurality of light blocking patterns BM1, BMk, and BMm vertically stacked, the viewing angle of the display device 11 may be adjusted. In addition, since the display device 11 does not cause a color mixture phenomenon, display quality may be improved.

Referring to FIG. 6, the x-axis of the graph may indicate the viewing angle of the display device, and the y-axis of the graph may indicate luminance according to the viewing angle. The first and second test lines EP1 and EP2 may represent test results of the comparative examples, and the third test line EP3 may represent test results of the embodiment of invention. In an embodiment, the first test line EP1 may represent a first test result for a display device that does not include a light blocking pattern, and the second test line EP2 may represent a second test result for a display device that includes only the third light blocking pattern BM3, for example. The third experiment line EP3 may represent a third test result for the display device 11 including the first to third light blocking patterns BM1, BM2, and BM3. Referring to the first test line EP1, a relatively high luminance was exhibited at a viewing angle of about 20 degrees (°) to about 90°. Referring to the second test line EP2, the luminance was lower than the first test line EP1 and higher than the third test line EP3 at a viewing angle of about 20° to about 90°. Referring to the third test line EP3, the luminance was lower than that of the first and second test lines EP1 and EP2 at a viewing angle of about 20° to about 90°. In other words, as the display device 11 includes a plurality of light blocking patterns vertically stacked, the viewing angle of the display device 11 may be adjusted.

Figure 7:
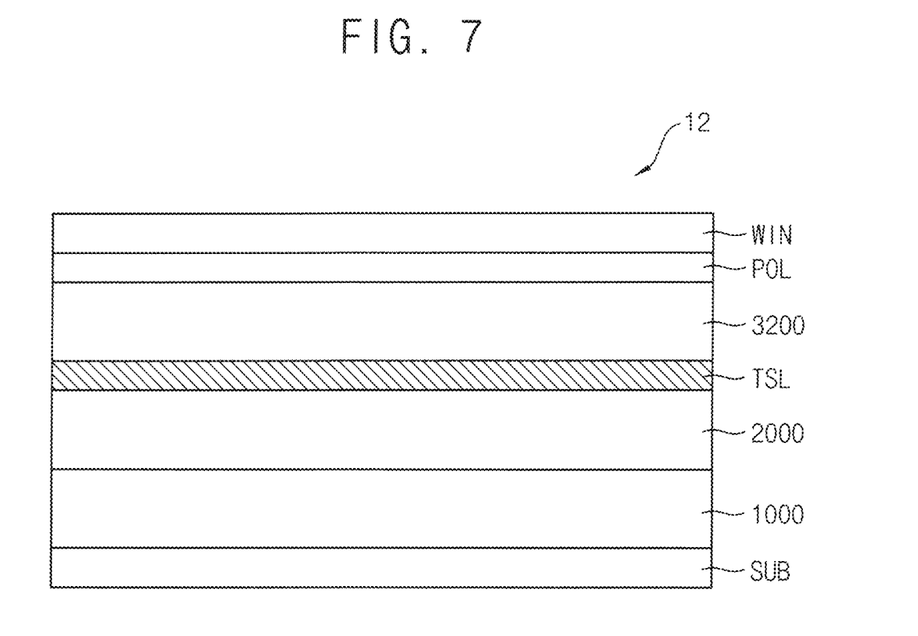
FIG. 7 is a cross-sectional view illustrating another embodiment of a display device of FIG. 1.

FIG. 7 is a cross-sectional view illustrating a display device according to another embodiment of FIG. 1.

Figure 8:
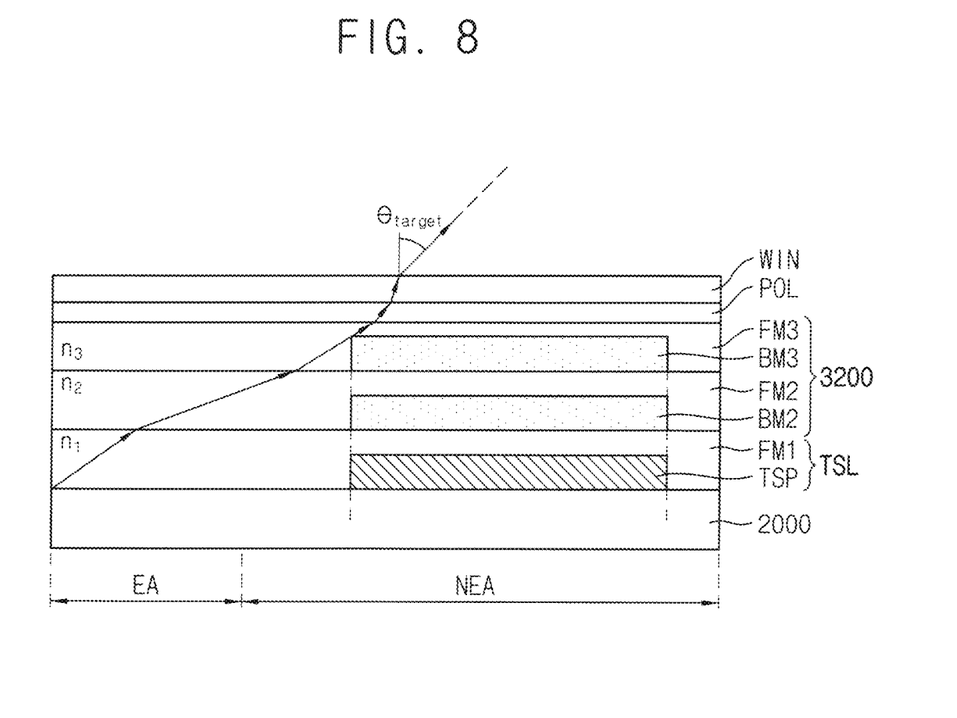
FIG. 8 is a cross-sectional view illustrating an embodiment of a display layer, a sensing layer, a refractive layer, a polarizing layer, and a window included in the display device of FIG. 7.

FIG. 8 is a cross-sectional view illustrating an embodiment of a display layer, a sensing layer, a refractive layer, a polarizing layer, and a window included in the display device of FIG. 7.

Referring to FIG. 7, a display device 12 according to another embodiment may include a substrate SUB, a transistor layer 1000, a display layer 2000, a sensing layer TSL, a refractive layer 3200, a polarizing layer POL, and a window WIN. However, the display device 12 may be substantially the same as the display device 11 described with reference to FIG. 2 except for the sensing layer TSL and the refractive layer 3200.

The sensing layer TSL may be disposed on the display layer 2000. The sensing layer TSL may include a plurality of sensing patterns. The sensing patterns may form sensing capacitances. The sensing layer may sense a user's touch based on changes in the sensing capacitances.

The refractive layer 3200 may be disposed on the sensing layer TSL. The refractive layer 3200 may include a plurality of filling layers and a plurality of light blocking patterns. The filling layers may refract the light, and the light blocking patterns may block the light.

Referring to FIGS. 7 and 8, the sensing layer TSL may include a sensing pattern TSP and a first filling layer FM1, and the refractive layer 3200 may include a second light blocking pattern BM2, a second filling layer FM2, a third light blocking pattern BM3, and a third filling layer FM3.

The sensing pattern TSP may be disposed on the display layer 2000. In an embodiment, the sensing pattern TSP may contact the encapsulation layer ENC (refer to FIG. 3). Accordingly, a thickness of the display device 12 may be reduced. In addition, the sensing pattern TSP may include a metal. In an embodiment, the sensing pattern TSP may include a metal such as molybdenum (Mo), titanium (Ti), aluminum (Al), or silver (Ag). Accordingly, the sensing pattern TSP may block light, for example.

The first filling layer FM1 may cover the sensing pattern TSP and may be disposed on the display layer 2000. In an embodiment, the first filling layer FM1 may include a flat top surface, and a refractive index of the first filling layer FM1 may be greater than one. In an embodiment, the first filling layer FM1 may include an organic material, for example.

The second light blocking pattern BM2 may be disposed on the first filling layer FM1. In an embodiment, the second light blocking pattern BM2 may block light. In an embodiment, the second light blocking pattern BM2 may include chromium (Cr), molybdenum (Mo), chromium oxide (CrOx), molybdenum oxide (MoOx), carbon pigment, black resin, or the like, for example.

In an embodiment, the second light blocking pattern BM2 may overlap the sensing pattern TSP. In an embodiment, a first width of the sensing pattern TSP may be the same as a second width of the second light blocking pattern BM2, for example.

The second filling layer FM2 may cover the second light blocking pattern BM2 and may be disposed on the first filling layer FM1. In an embodiment, the second filling layer FM2 may include a flat top surface, and a refractive index of the second filling layer FM2 may be greater than one. In an embodiment, the second filling layer FM2 may include an organic material, for example.

The third light blocking pattern BM3 may be disposed on the second filling layer FM2. In an embodiment, the third light blocking pattern BM3 may block light. In an embodiment, the third light blocking pattern BM3 may include at least one of chromium (Cr), molybdenum (Mo), chromium oxide (CrOx), molybdenum oxide (MoOx), carbon pigment, black resin, and the like, for example.

In an embodiment, the third light blocking pattern BM3 may overlap the sensing pattern TSP and the second light blocking pattern BM2. In an embodiment, a third width of the third light blocking pattern BM3 may be the same as the first width and the second width, for example.

The third filling layer FM3 may cover the third light blocking pattern BM3 and may be disposed on the second filling layer FM2. In an embodiment, the third filling layer FM3 may include a flat top surface, and a refractive index of the third filling layer FM3 may be greater than one. In an embodiment, the third filling layer FM3 may include an organic material, for example.

In an embodiment, the sensing pattern TSP, the second light blocking pattern BM2, and the third light blocking pattern BM3 may overlap each other. In addition, the sensing pattern TSP, the second light blocking pattern BM2, and the third light blocking pattern BM3 may overlap the non-emission area NEA and may not overlap the emission area EA. In addition, the first to third widths may be the same as one another and may be smaller than the width of the non-emission area NEA.

The sensing layer TSL and the sensing pattern TSP may be an embodiment of one of an arbitrary metal layer and an arbitrary metal pattern disposed on the display layer 2000. In other words, a metal pattern disposed between the display layer 2000 and the window WIN and capable of blocking light may be utilized as the first light blocking pattern BM1 described with reference to FIG. 4.

The display device 12 may have a structure in which the first light blocking pattern BM1 of the display device 11 described with reference to FIG. 4 is replaced with the sensing pattern TSP. As the display device 12 includes the sensing layer TSL, the display device 12 may sense a user's touch. In addition, as the sensing pattern TSP blocks light, the viewing angle of the display device 12 may be adjusted. In addition, since the display device 12 does not cause a color mixture phenomenon, display quality may be improved.

Figure 9:
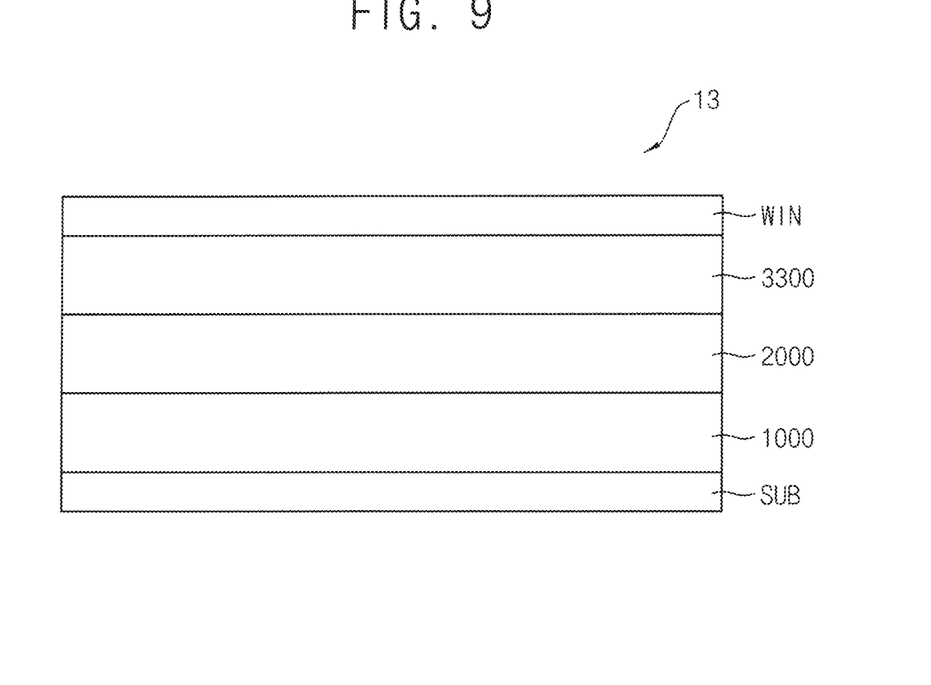
FIG. 9 is a cross-sectional view illustrating another embodiment of a display device of FIG. 1.
Figure 10:
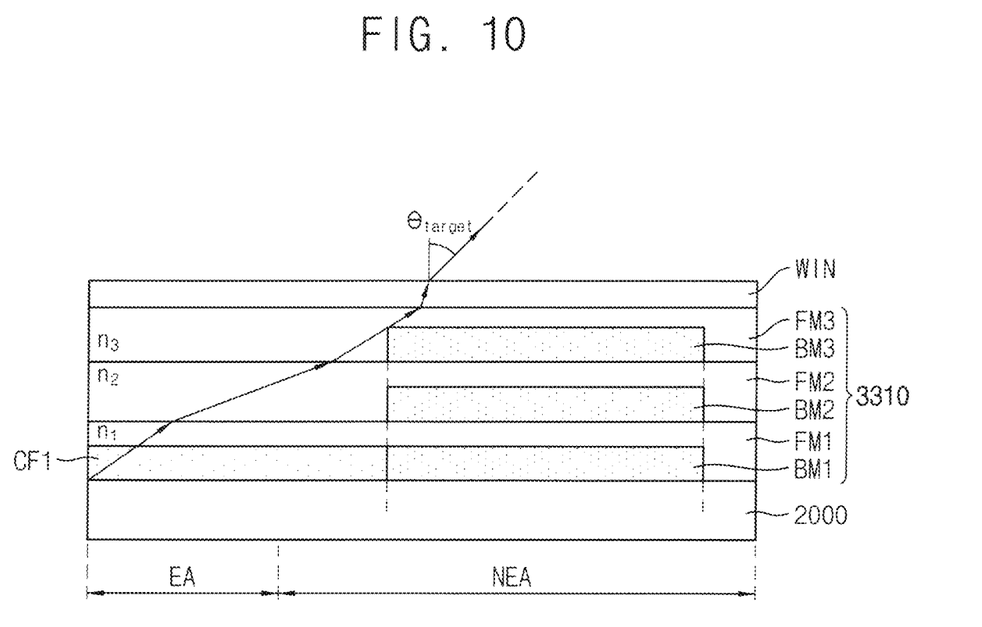
FIG. 10 is a cross-sectional view illustrating an embodiment of a display layer, a refractive layer, and a window included in the display device of FIG. 9.
Figure 11:
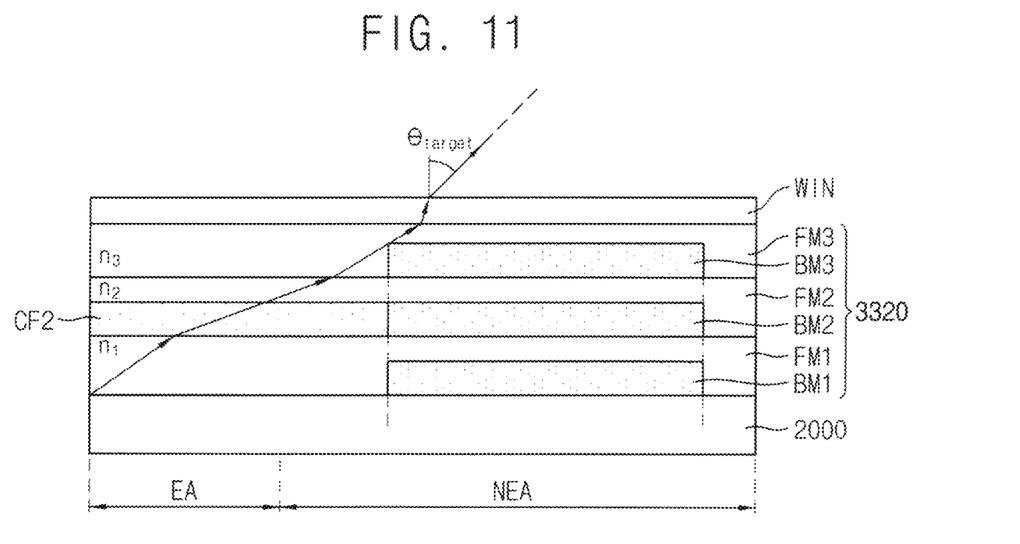
FIG. 11 is a cross-sectional view illustrating another embodiment of a display layer, a refractive layer, and a window included in the display device of FIG. 9.

FIG. 9 is a cross-sectional view illustrating another embodiment of a display device of FIG. 1. FIG. 10 is a cross-sectional view illustrating an embodiment of a display layer, a refractive layer, and a window included in the display device of FIG. 9. FIG. 11 is a cross-sectional view illustrating another embodiment of a display layer, a refractive layer, and a window included in the display device of FIG. 9.

Referring to FIG. 9, a display device 13 in another embodiment may include a substrate SUB, a transistor layer 1000, a display layer 2000, a refractive layer 3300, and a window WIN. The display device 13 may be substantially the same as the display device 11 described with reference to FIG. 2 except for the refractive layer 3300. In addition, the refractive layer 3300 may include a plurality of color filters, and the display device 13 may not include the polarizing layer POL described above.

The refractive layer 3300 may be disposed on the display layer 2000. The refractive layer 3300 may include a plurality of filling layers, a plurality of light blocking patterns, and a plurality of color filters. The filling layers may refract light, the light blocking patterns may block light, and the color filters may block light corresponding to a wavelength band of a predetermined color. As the refractive layer 3300 includes the color filters, the display device 13 may not include the polarizing layer POL described above, and the color filters may reduce reflection of external light to improve color reproducibility of the display device 13.

Referring to FIGS. 9 and 10, the refractive layer 3310 may include a first light blocking pattern BM1, a first filling layer FM1, a first color filter CF1, a second light blocking pattern BM2, a second filling layer FM2, a third light blocking pattern BM3, and a third filling layer FM3. However, the refractive layer 3310 may be substantially the same as the refractive layer 3110 described with reference to FIG. 4 except for the first color filter CF1 and the first filling layer FM1.

The first color filter CF1 may be disposed on the display layer 2000. In an embodiment, the first color filter CF1 may contact the first light blocking pattern BM1 and may overlap the emission area EA, for example. In addition, the first filling layer FM1 may cover the first color filter CF1 and the first light blocking pattern BM1 and may be disposed on the display layer 2000.

Referring to FIGS. 9 and 11, the refractive layer 3320 may include a first light blocking pattern BM1, a first filling layer FM1, a second light blocking pattern BM2, a second color filter CF2, a second filling layer FM2, a third light blocking pattern BM3, and a third filling layer FM3. However, the refractive layer 3320 may be substantially the same as the refractive layer 3110 described with reference to FIG. 4 except for the second color filter CF2 and the second filling layer FM2.

The second color filter CF2 may be disposed on the first filling layer FM1. In an embodiment, the second color filter CF2 may contact the second light blocking pattern BM2 and may overlap the emission area EA, for example. In addition, the second filling layer FM2 may cover the second color filter CF2 and the second light blocking pattern BM2 and may be disposed on the first filling layer FM1.

The display device in embodiments may include a display layer, a refractive layer disposed on the display layer, and a window disposed on the refractive layer. The refractive layer may include a plurality of light blocking patterns, and the light blocking patterns may be vertically stacked. The light blocking patterns may block light. Accordingly, light passing through the window may pass through the window at an angle smaller than the target angle. In other words, light passing through the window at an angle greater than the target angle may be blocked by any one of the light blocking patterns before passing through the window. Accordingly, the viewing angle of the display device may be adjusted, and the display quality may be improved since the display device does not cause a color mixture phenomenon.

Although certain exemplary embodiments and implementations have been described herein, other embodiments and modifications will be apparent from this description. Accordingly, the invention is not limited to such embodiments, but rather to the broader scope of the appended claims and various obvious modifications and equivalent arrangements as would be apparent to a person of ordinary skill in the art.

What is claimed is:

1. A display device comprising:
    a display layer disposed on a substrate and including an emission area from which light is emitted and a non-emission area adjacent to the emission area;
    a functional layer disposed on the display layer and including a first light blocking pattern, a second light blocking pattern disposed on the first light blocking pattern, a first filling layer covering the first light blocking pattern, and a second filling layer covering the second light blocking pattern; and
    a cover layer disposed on the functional layer,
    wherein a lower surface, which faces the display layer, of the first light blocking pattern coincides with a lower surface, which faces the display layer, of the first filling layer, and
    wherein each of a first width of the first light blocking pattern and a second width of the second light blocking pattern is smaller than a width of the non-emission area, and the first width and the second width are identical to each other.

2. The display device of claim 1, wherein a lower surface of the second light blocking pattern coincides with a lower surface of the second filling layer.

3. The display device of claim 1, wherein the first functional layer contacts the second light blocking pattern.

4. The display device of claim 1, wherein the first functional layer contacts an upper surface and side surfaces of the first light blocking pattern.

5. The display device of claim 1, wherein the first light blocking pattern and the second light blocking pattern overlap each other.

6. The display device of claim 1, wherein the first light blocking pattern and the second light blocking pattern overlap the non-emission area.

7. The display device of claim 1, wherein the first light blocking pattern and the second light blocking pattern do not overlap the emission area.

8. The display device of claim 1, wherein
    the first filling layer includes a flat surface, and
    the second filling layer is disposed on the first filling layer.

9. The display device of claim 8, wherein the second light blocking pattern contacts the first filling layer.

10. The display device of claim 8, wherein a first refractive index of the first filling layer and a second refractive index of the second filling layer are greater than one.

11. The display device of claim 1, wherein the functional layer further includes a third light blocking pattern disposed on the second light blocking pattern.

12. The display device of claim 1, further comprising:
    a polarizing layer disposed between the functional layer and the cover layer.

13. The display device of claim 1, further comprising:
    a sensing pattern disposed between the display layer and the functional layer and including a metal.

14. The display device of claim 13, wherein the sensing pattern, the first light blocking pattern and the second light blocking pattern overlap each other.

15. The display device of claim 13, wherein the display layer further includes:
   a first electrode overlapping the emission area;
   an emission layer disposed on the first electrode and overlapping the emission area;
   a pixel defining layer overlapping the non-emission area;
   a second electrode disposed on the pixel defining layer and the emission layer; and
   an encapsulation layer disposed on the second electrode, and
   wherein the sensing pattern contacts the encapsulation layer.

16. The display device of claim 1, wherein the functional layer further includes a color filter overlapping the emission area.

17. The display device of claim 16, wherein the color filter contacts the first light blocking pattern.

18. The display device of claim 16, wherein the color filter contacts the second light blocking pattern.

\* \* \* \* \*